United States Patent [19]
Debusk

[11] Patent Number: 6,127,289
[45] Date of Patent: *Oct. 3, 2000

[54] METHOD FOR TREATING SEMICONDUCTOR WAFERS WITH CORONA CHARGE AND DEVICES USING CORONA CHARGING

[75] Inventor: Damon Keith Debusk, Orlando, Fla.

[73] Assignee: Lucent Technologies, Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/924,268

[22] Filed: Sep. 5, 1997

[51] Int. Cl.[7] .......................... H01L 21/477; H01L 21/26
[52] U.S. Cl. ........................................ 438/798; 438/795
[58] Field of Search .................... 438/795, 798; 399/174, 175, 176, 170; 361/221, 225, 229

[56] References Cited

U.S. PATENT DOCUMENTS

| | | | |
|---|---|---|---|
| 4,007,294 | 2/1977 | Woods et al. ........................ | 438/474 |
| 4,086,650 | 4/1978 | Davis et al. ........................ | 361/229 |
| 5,075,257 | 12/1991 | Hawk et al. ........................ | 438/479 |
| 5,316,970 | 5/1994 | Batchelder et al. .................. | 250/424 |
| 5,485,091 | 1/1996 | Verkuil ................................ | 324/455 |
| 5,773,989 | 6/1998 | Edelman et al. ..................... | 324/765 |

OTHER PUBLICATIONS

Inaba et al., "Neutralization of Wafer Charging in Nitrogen Gas", IEEE Transactions on Semiconductor Manufacturing, vol. 5, No. 4, pp. 359–367, Nov. 1992.

*Primary Examiner*—Carl Whitehead, Jr.
*Assistant Examiner*—Maria Guerrero

[57] ABSTRACT

A method of treating the surface of a semiconductor wafer is disclosed for making the wafer resistant to particle adhesion, the method involving the application of a uniform corona charge to the wafer surface. The corona charge is deposited on the wafer using commercially available tools, and if necessary, it may be later removed by immersing the wafer in deionized water or by depositing a compensating corona charge over the wafer of opposite polarity relative to the originally-applied charge.

11 Claims, 1 Drawing Sheet

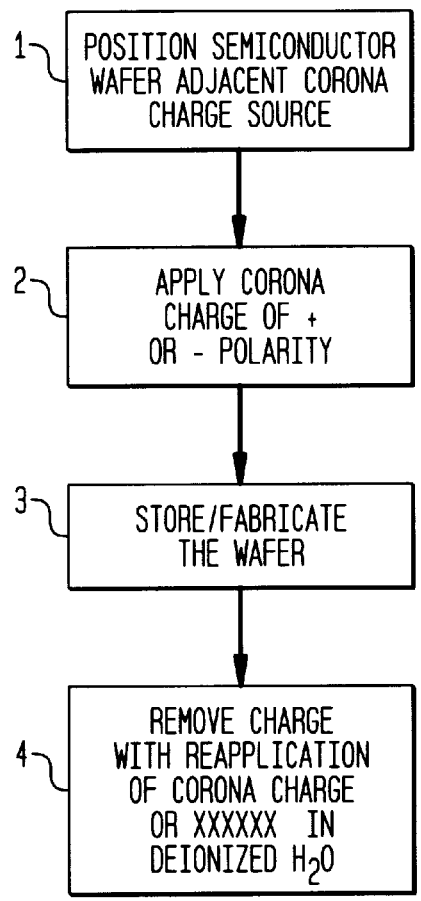
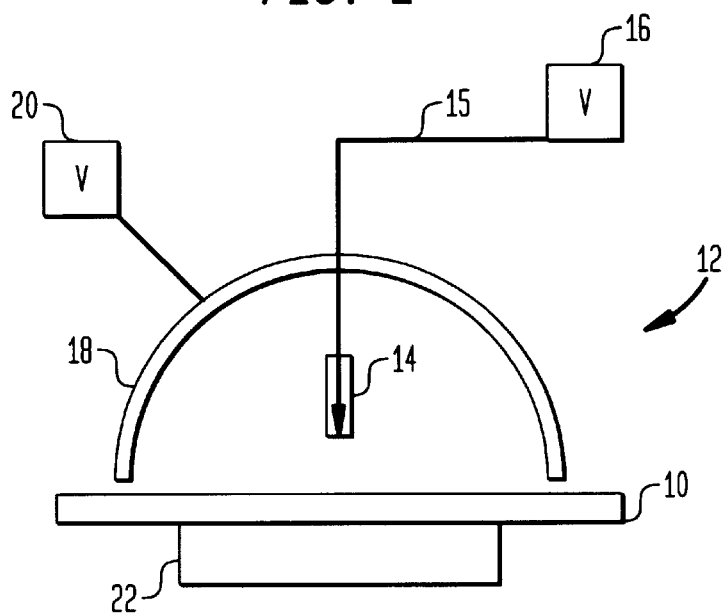

United States Patent [19]

METHOD FOR TREATING SEMICONDUCTOR WAFERS WITH CORONA CHARGE AND DEVICES USING CORONA CHARGING

FIELD OF THE INVENTION

The present invention relates to a method of reducing particle depositions on semiconductor wafers and, more particularly, to a method for reducing particle depositions by applying a blanket corona charge on the semiconductor wafer surface so that particles are repelled while the wafer is being stored or fabricated.

BACKGROUND OF THE INVENTION

It is important for the production of reliable and efficacious semiconductor wafers that they be kept free from particles and organic film depositions that may adhere to the wafers during fabrication or storage. Indeed, reducing particles or defects on semiconductor wafers is one of the major issues involved in producing high-yield integrated-circuit devices. A semiconductor wafer is typically fabricated from silicon with various materials implanted or applied on its surface. Airborne contaminants may adhere to this surface, or contaminants may become deposited on the surface from other sources during or after wafer fabrication, such as from the wafer holder, chemical solutions, storage boxes, machines, other wafers, or the like. Even deionized water used in a rinsing step may introduce particles that adhere to the wafer surface. As wafers become smaller, even very small particles may adhere to the wafer, decreasing the yield and product reliability. Despite the significance of this problem, present industry knowledge and technology have been unable to fully address or eliminate it and instead, numerous pre- and post-fabrication cleaning processes have been invoked.

To illustrate, under prior art methods, the particle contaminants have been addressed through use of a multitude of cleaning or wafer-protection techniques, such as chemical pre-cleaning methods; strict control over the wafer environment during fabrication and storage; and/or through post-fabrication rinsing or cleaning processes. Known approaches for controlling particle deposition include a wafer scrubbing and pre-cleaning combination, referred to as RCA-type cleaning (typically $NH_4OH+H_2O_2$, then $HCl+H_2O$, followed by de-ionized water rinse), with or without ultrasonic or megasonic functions, and/or use of mini-environments such as standard mechanical interface (SMIF) containers designed to control the wafer environment. Many cleaning processes have been used, including wet-chemical, vapor dry etching, and electron flux irradiation techniques.

The instant invention has advantages in that it provides a method of reducing semiconductor wafer sensitivity to contaminants, thus avoiding or reducing the need to depend upon chemical pre-cleaning or wafer scrubbing applications. Further advantages may appear more fully upon consideration of the description below.

SUMMARY OF THE INVENTION

Summarily described, the invention embraces a method of treating a semiconductor wafer to render it resistant to particle adhesion, the method involving the deposition of a blanket corona charge on the semiconductor wafer to temporarily modify its surface charge potential so that particles are repelled. The wafer can be stored or fabricated after deposition of the charge. If charge remains on the wafer after fabrication, it can be removed by immersing the wafer in deionized water or reapplying a corona charge of opposite polarity. The invention further embraces semiconductor wafers resistant to particle deposition fabricated according to this method.

BRIEF DESCRIPTION OF THE DRAWINGS

For a better understanding of the invention, an exemplary embodiment is described below, considered together with the accompanying drawings, in which:

FIG. 1 is a block diagram showing the steps of the present invention method; and FIG. 2 illustrates an apparatus for performing the present invention method.

It is to be understood that the drawings are provided to illustrate the concept of the invention and are not to scale.

DETAILED DESCRIPTION OF THE INVENTION

Referring to FIG. 1, there is shown a block diagram for performing the steps of the inventive method. The first step of the method, as noted in block 1, comprises providing the semiconductor wafer and corona charge source and positioning them adjacent each other so that the charge can be uniformly applied to the wafer surface.

Referring to FIG. 2, there is shown the semiconductor wafer 10 and charge source 12. The wafer 10 to be treated should be freshly cleaned. The corona charge source 12 may comprise any one of the many commercially available tools known in the art for applying a corona charge. Suitable examples for applying the charge include a corona charging device as described in U.S. Pat. No. 4,086,650 issued to Davis and assigned to Xerox Corporation, entitled "Corona Charging Device." (The process of applying the charge herein is similar to the process of applying a corona charge as used in photocopying or Xeroxing applications.) The corona charging station manufactured by Semiconductor Diagnostics, Inc., STI Model 3030, which is known, has been shown to be advantageous for this application. Generally, the corona charge source 12 comprises a conductive corona electrode 14 connected by an elongated wire 15 to a voltage source 16, and a conductive shield 18 surrounding the electrode, which may also be connected to a second voltage source 20 or electrically grounded. Various arrangements are known in the art and need not be repeated here at length.

The wafer 10 is shown in FIG. 2 mounted on a vacuum chuck 22 for placement adjacent the corona charge source 12. The substrate preferably has a flat surface so that the wafer may be held in a horizontal plane relative the charging source to ensure that a uniform charge will be applied over the surface of the wafer. The spacing between the wafer and the corona source according to the invention should be typically between one and two inches. As noted, the Semiconductor Diagnostic's charging station has proved advantageous. With that station, the wafer 10 is secured in a stationary horizontal position on a vacuum chuck 22, as depicted in FIG. 2. The charging source is then passed back and forth laterally over the surface of the wafer.

Referring now to FIG. 1, once the wafer and charging source have been positioned, a blanket corona charge is then deposited over the wafer surface, the charge having either a positive or negative polarity (block 2). Whether a positive or negative charge is applied may be dictated by the electrostatic properties of the specific material attempted to be repelled. Also, if one desires to later remove the charge, this can be done by depositing a compensating corona charge of opposite polarity over the wafer.

The desired charge can be easily determined by measuring the resulting contact potential difference, frequently referred to as $V_{ox}$ (oxide voltage). The desired time or voltage is again dependent on electrostatic properties of the specific materials attempting to be repelled and the electrical field tolerance of any film on the wafer surface. For instance, the resulting electrical field from a deposited corona charge should not exceed the electrical breakdown field of a film, such as $SiO_2$, on the wafer surface. The magnitude of this charge is generally controlled by the number of passes (time) through the corona field region.

Once the uniform charge is applied, the wafer is ready for storage and/or fabrication (FIG. 1, block 3). The corona charge deposited on the semiconductor wafer surface will cause the wafer to repel specific particle types (depending on their electrostatic characteristics), while the wafers are being stored or during the wafer fabrication process, thereby avoiding the necessity of further pre-cleaning or rinsing techniques. The particles to be repelled may come from a variety of sources, such as the equipment, materials, processes, and humans.

The types of particles to be repelled include molecular, gaseous (adsorbed gases and vapors), ionic (i..e., $Na^+$, Cl-, $So4-2$, fluoride species, and ionic organic compounds), and atomic (electrochemically-plated Au, Ag, and Cu films, and particles of Si, Fe and Ni), particles. Ionic organic compounds might include aliphatic hydrocarbons (i.e., methyl and dimethyl cyclohexanes), aromatic hydrocarbons (i.e., xylenes and benzenes), chlorinated compounds (i.e., chloroethanes, chloroethylenes, and chlorobenzenes), and other compounds (i.e., isopropanol, Freon, silicones, limonene, butyl and cellosolve acetates, and n-methyl pyrrolidine). These ions, some negatively and some positively charged, may come from sources such as storage containers, mini-environments, clean room paper, gloves, chemicals, and from the clean room environment. Methylpropanolamine and morpholine, for example, are commonly used in humidity control systems for cleanrooms, can be detected on wafer surfaces, and are known to cause "hazing" on silicon wafer surfaces. The molecular particles may block and mask operations, impair adhesion, form deleterious decomposition products, and nucleate defects in films. Ionic types may diffuse on the wafer surface, cause electrical device defects, degrade performance and yield, cause crystal defects, and lower oxide breakdown fields. Atomic types may diffuse readily, cause surface conduction, decrease the carrier lifetime, degrade electrical device performance, lower product yield, nucleate crystal defects, or short-out conductor lines. Thus, it is desirable that these particles be repelled.

The corona charge applied to repel these particles will most likely dissipate during the fabrication process and need not be removed. If removal is considered necessary, however, this can be accomplished by immersing the wafer in deionized water applying rinsing techniques that are well known in the art, or by applying a corona charge of opposite polarity over the original charge (FIG. 1, block 4).

It will be understood that the embodiments described herein are merely exemplary and that a person skilled in the art may make variations and modifications without departing from the spirit and scope of the invention. All such variations and modifications are intended to be included within the scope of the appended claims.

I claim:

1. A method of treating a semiconductor wafer to provide a semiconductor wafer resistant to particle depositions, the method comprising the steps of:

(a) providing the semiconductor wafer having a surface with a surface charge potential;

(b) positioning the semiconductor wafer so that the surface is disposed adjacent a corona charging source;

(c) depositing a substantially uniform corona charge over the surface of the semiconductor wafer to modify the surface charge potential of the semiconductor wafer to define the semiconductor wafer adapted to resist particle depositions; and (d) disposing the semiconductor wafer in an apparatus for storage or fabrication of the semiconductor wafer wherein the surface charge potential of the semiconductor wafer repels particles during the storage or fabrication, thereby reducing the need for chemical applications to cleanse the semiconductor wafer.

2. The method according to claim 1, further comprising the step of (d) removing the charge deposited on the wafer by applying a second corona charge over the surface of the wafer of opposite polarity to the substantially uniform charge applied pursuant to step (c).

3. The method according to claim 1, further comprising the step of (d) immersing the wafer in a bath of deionized water to remove the substantially uniform charge applied pursuant to step (c).

4. The method according to claim 1, wherein the step of positioning the semiconductor wafer comprises securing the wafer on a substantially horizontal plane on a vacuum chuck.

5. The method according to claim 4, wherein the step of positioning the semiconductor wafer adjacent the charging source comprises disposing a corona charging station from about one to two inches above the surface of the wafer.

6. The method according to claim 5, wherein the step of applying the substantially uniform charge involves holding the wafer stationary while passing a corona charging gun back and forth over the surface of the wafer.

7. The method according to claim 6, wherein the step of applying the substantially uniform charge involves applying a charge of positive polarity.

8. The method according to claim 6, wherein the step of applying the substantially uniform charge involves applying a charge of negative polarity.

9. The method according to claim 6, further comprising the step of measuring the contact potential difference on the surface of the wafer to determine the desired charge level.

10. A method for providing a semiconductor wafer resistant to the deposition of particles and having an improved stability, the method comprising the steps of:

(a) providing the semiconductor wafer having a surface with a surface charge potential;

(b) positioning the semiconductor wafer adjacent a corona charging source;

(c) depositing a substantially uniform corona charge over the surface of the semiconductor wafer to modify the surface charge potential of the semiconductor wafer; and (d) storing or fabricating the semiconductor wafer wherein the semiconductor wafer repels particles during such storage or fabrication to provide the semiconductor wafer having the improved stability without use of irradiation, wafer scrubbing, or chemical cleansing processes.

11. A method for pre-treating a semiconductor wafer to provide a semiconductor wafer resistant to the deposition of particles, the method consisting essentially of the steps of:
- (a) providing the semiconductor wafer having a surface adapted for use in fabricating active components of a semiconductor device;
- (b) positioning the semiconductor wafer adjacent a corona charging source; and
- (c) depositing a substantially uniform corona charge over the surface of the semiconductor wafer to modify the surface charge potential of the semiconductor wafer and provide the semiconductor wafer resistant to the deposition of particles, wherein the time and voltage of the corona charge results in an electrical field that is less than the electrical breakdown field of the material comprising the surface of the semiconductor wafer, whereby the active components of the semiconductor device may be deposited on the surface of the semiconductor wafer without use of irradiation, wafer scrubbing, or chemical cleansing processes.

* * * * *